United States Patent [19]

Hundelshausen, deceased et al.

[11] 3,990,771

[45] Nov. 9, 1976

[54] APPARATUS AND METHOD FOR HOLOGRAPHIC STORAGE OF DATA

[75] Inventors: Ulrich V. Hundelshausen, deceased, late of Munich, Germany; by Burkhard V. Hundelshausen, heir; by Irmela V. Bismarck, heir, both of Munich, Germany; Hans Eschler, Taufkirchen, Germany; Manfred Lang, Munich, Germany; Gerd Goldmann, Taufkirchen, Germany; Peter Graf, Munich, Germany; Horst Kiemle, Neuried, Germany

[73] Assignee: Siemens Aktiengesellschaft, Berlin & Munich, Germany

[22] Filed: Mar. 22, 1974

[21] Appl. No.: 453,922

[30] Foreign Application Priority Data

Mar. 26, 1973 Germany............................ 2315020

[52] U.S. Cl.................................. 350/3.5; 350/173
[51] Int. Cl.² .......................................... G03H 1/30
[58] Field of Search............... 350/3.5, DIG. 1, 171, 350/173, 169; 250/578

[56] References Cited

UNITED STATES PATENTS

| | | | |
|---|---|---|---|
| 3,279,341 | 10/1966 | Arkell et al..................... | 350/DIG. 1 |
| 3,330,904 | 7/1967 | Gebel................................. | 350/171 |
| 3,403,260 | 9/1968 | Geusic et al................... | 350/DIG. 1 |
| 3,403,261 | 9/1968 | Bowers et al....................... | 350/171 |
| 3,534,158 | 10/1970 | Eilenberger........................ | 350/173 |
| 3,582,183 | 6/1971 | Schmidt.......................... | 350/3.5 UX |

OTHER PUBLICATIONS

Chang et al, *Nerem Record*-1969, pp. 8–9.

*Primary Examiner*—Ronald J. Stern
*Attorney, Agent, or Firm*—Hill, Gross, Simpson, Van Santen, Steadman, Chiara & Simpson

[57] ABSTRACT

Apparatus and method for holographic storage of data utilizing a light source and a number of light deflectors such that a single beam can be used to read data from a number of different holograms simultaneously.

5 Claims, 3 Drawing Figures

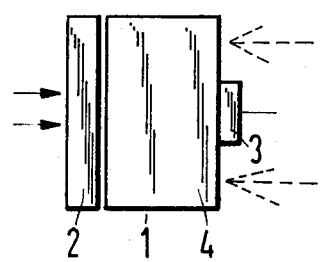
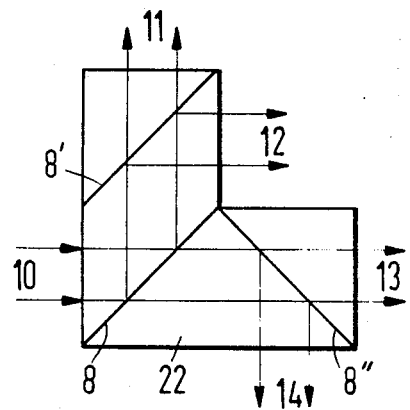
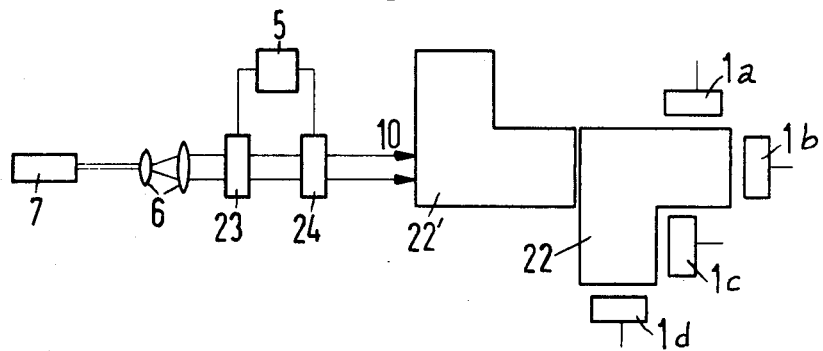

APPARATUS AND METHOD FOR HOLOGRAPHIC STORAGE OF DATA

BACKGROUND OF THE INVENTION

1. Field of the Invention

This invention relates in general to storage devices and in particular to a holographic data storage wherein a single scanning beam is utilized to read information from a plurality of holographic storage plates.

2. Description of the Prior Art

As computers have become more and more common, the requirement for greater storage capacity and more rapid access to information has become desirable. Storage in holographic form has been proposed which makes it possible to store information in greater density than that possible with prior storage techniques, as for example, magnetic storage. It has been know to spacially modulate coherent light and to store the data holographically. In such storage devices, any interference pattern can be assigned one unit of binary data or one bit. The presence of the pattern corresponds to the binary 1, and its absence to the binary 0.

With the aid of holograms, it is possible to project images to arbitrary positions in space without the assistance of optical elements. Therefore it is possible to construct holographic storage devices with non-mechanical, random access which can have very large capacities. The use of holographic storage techniques overcomes tolerance problems such as occur in other high capacity optical storage devices since the data output is obtained by interrogating an image with a relatively crude structure located outside the hologram.

Each holographically stored bit corresponds to a single spot on an object surface whose associated interference field is uniformly stored on the entire hologram surface. Holographic storage is substantially immune to dust, local scratches and inhomogeneities of the storage medium, since local disturbances on the hologram result merely in a slight reduction in the signal to noise ratio. The spots are arranged as a grid pattern; and if this spot grid pattern is coherently illuminated from the side facing away from the hologram surface, the binary numbers can be recorded in parallel form onto the hologram.

If the data stored in such structure are to be read out in parallel, a special photo-detector will be required for each bit. Due to cost consideration, it will normally be prohibitive to emit the entire contents of a large capacitive storage device in parallel.

SUMMARY OF THE INVENTION

In the present invention, holographic storage devices are divided into a plurality of small subsidiary holograms (subhologram) each of which has a small fraction of the total capacity of the entire memory system and generally lies in the order of $10^3$ to $10^5$ bits. During read out, one subhologram will be reconstructed by being illuminated by a reproducing beam having the cross-sectional area of the subsidiary subhologram. The beam is directed over the entire storage surface by means of a deflecting unit so that the selected subhologram can be read.

In such a storage device, the capacity of the memory will be the product of the number of subholograms (this number determines the number of distinct beam deflection positions provided by the deflector unit) and of the capacity of 1 subhologram.

Since the storage density of a non-mechanical holographic storage device is limited to a few $10^4$ bits per $mm^2$, a large capacity store, as for example of approximately $10^{10}$ bits requires a storage area of approximately $1 m^2$. Also, the dimensions of the required detector matrix will be of the same order which gives rise to difficulties with the optical set up.

It is an object of the present invention to provide an arrangement for holographic storage of data in which it is possible to read out more than $10^9$ bits without difficulty.

It is a feature of the present invention that the storage medium is composed of a plurality of storage modules. A plurality of beam dividers are mounted between the light deflector and the storage modules in such a way the the beam divider unit emits light beams corresponding to several storage modules.

In an advantageous embodiment, the storage modules consist of a transparent body, the side upon which the oncoming light beam is incident having a fixed or exchangeable holographic storage plate and the side of the storage module away from the incident oncoming light beam facing a detector matrix. In this embodiment, the light passes completely through the storage module.

Another advantageous embodiment provides a storage module having a transparent body and wherein the side facing way from the oncoming light has a fixed or exchangeable storage plate which has a reflector and a detector matrix is mounted adjacent the side upon which the incident light beam impinges.

The present invention provides for beam divider means which consist of an angle-shaped, transparent body which is provided with one or more light dividing surfaces arranged such that incoming light beam is split into a plurality of emerging subsidiary light beams and in a preferred embodiment, the emerging subsidiary light beams pass through the same number of light dividing surfaces. An advantageous embodiment of the invention provides light dividers wherein the light dividing surfaces are formed so that the reflected and transmitted subsidiary beams of light have the same intensity.

The light dividing surfaces may be multiple spot holograms.

Other objects, features and advantages of the invention will be readily apparent from the following description of certain preferred embodiments thereof, taken in conjunction with the accompanying drawing, although variations and modifications may be effected without departing from the spirit and scope of the novel concepts of the disclosure, and in which:

BRIEF DESCRIPTION OF THE DRAWING

FIG. 1 illustrates a storage module,

FIG. 2 illustrates a beam dividing apparatus, and

FIG. 3 is a block diagram illustrating a holographic storage device for data.

DESCRIPTION OF THE PREFERRED EMBODIMENTS

The present invention is based on the perception that the storage capacity of a holographic storage unit comprising a single storage plate with surface holograms and an integrated detector matrix is limited to approximately $10^8$ bits because of diffraction and problems associated with deflecting and controlling the beam.

The present invention utilizes a single beam which is divided into a multiplicity of beams, each of which is used to read a separate holographic storage unit, each of which has its own associated detector matrix.

FIG. 1 illustrates a storage module 1 of the invention which has a capacity of approximately $7 \times 10^7$ bits. The storage module 1 consists of a glass carrier member 4 which may have dimensions in a specific example of $60 \times 60 \times 35$ mm and which includes an integrated semiconductor-detector matrix 3 which might have $32 \times 36$ elements. The detector matrix 3 is mounted on the side of the device 1 away from that which the beam enters and a storage plate 2 is mounted on the side of the module 1 at which the beam enters. The storage plate 2 may have $256 \times 256$ subsidiary holograms.

The light beam is illustrated by arrows and passes through the storage plate 2 then through the glass carrier 4 and to the detector 3.

FIG. 2 illustrates a suitable beam dividing element 22 useful in the large capacitive storage device of the invention.

The storage device 22 can comprise an L-shaped glass body portion into which the incident light beam 10 enters adjacent the junction of the legs of the L-shaped member as shown in FIG. 2 and parallel to the sides of one of the legs. Three light dividing surfaces 8, 8′, and 8″ are formed within the element 22. For example, the first light dividing surface 8 extends at a 45° angle between the junction defining the two legs of the L-shaped element. The second light dividing surface 8′ extends parallel to the light dividing surface 8 from a point at the upper right corner of the vertical leg relative to FIG. 2 as shown.

The third light dividing surface 8″ extends from the bottom end of the lower leg to the inter junction of the two legs as shown in FIG. 2.

An incident light beam 10 passes parallel through the lower leg relative to FIG. 2, and a portion of the incident beam passes through the leg including the light dividing surfaces 8 and 8″ and emerges as a beam 13 parallel to the incoming beam 10. A portion of the beam 10 will be reflected on the light reflecting surface 8 vertically relative to FIG. 2 up through the vertical leg and will pass through the light dividing surface 8′ and will emerge as a subsidiary beam 11 from the upper end of the vertical leg.

A portion of the beam deflected from the light dividing surface 8 will engage the light dividing surface 8′ and will be reflected horizontally out of the upper leg relative to FIG. 2 to form a light beam 12. A portion of the beam which passes horizontally through the light dividing surface 8 will be deflected downwardly by the light dividing surface 8″ to form a beam 14 as shown. The light dividing surfaces 8, 8′, and 8″ are designed such that the beams 11, 12, 13, and 14 will have equal intensities, and thus, the beam dividing element 22 divides the incoming light beam 10 into four light beams of equal intensities.

FIG. 3 is a schematic arrangement of the holographic storage device according to the invention utilizing a number of storage modules and a pair of beam dividing elements such as shown in FIG. 2. A laser 7 which is the beam source for all of the modules 1 supplies a beam through an optical expansion system 6. The beam then passes through a pair of light deflectors 23 and 24 which are controlled by an electronic drive 5. 10 designates the read out light beam which is supplied to the beam dividing element 22. In the arrangement of FIG. 3, two light dividing elements 22 and 22′ are illustrated each of which divide the incoming beam into four equal intensity output beams. For example, the beam emerging from the light dividing element 22′ is divided into four equal intensity beams, one of which passes into the light dividing element 22. The light dividing element 22 divides the incident beam into four equal light beams which respectively impinge on the storage modules $1a$, $1b$, $1c$, and $1d$. Each of the subholograms associated with the storage modules $1a$, $1b$, $1c$, and $1d$ is simultaneously read out; and thus, the single beam passing into the light divider 22 is divided into four equal beams so as to energize the storage modules $1a$, $1b$, $1c$, and $1d$. It is to be realized, of course, the three additional light dividing elements such as element 22 may be mounted relative to the light dividing element 22′ and that each of these three light dividing elements may have associated therewith four storage modules so that a multiplicity of storage modules can be read from the single beam 10. Although in the embodiment illustrated in FIG. 1, the light beam passes first through the storage plate 2 then through the glass carrier plate 4 and to the detector 3, it should be realized that the incident light beam may pass as shown by dotted arrows through the glass carrier plate 4 then to the storage plate 2 where its reflected back to the detector matrix 3.

The access to the total data is random and the access time is determined by the light power which hits the detector elements associated with each of the storage modules 1 and therefore is dependent upon the capacity of the memory.

Since the read out beam 10 is only very slightly attenuated as it passes through a hologram, it is possible to use the beam for reading out a second hologram. For such usage, a plurality of storage modules are arranged in series and are read out with the same read out beam. Due to the reduction of energy of the read out beam, a longer access time may be required in such embodiments.

It should also be realized that in order to shorten the access time active beam dividers can be utilized in place of the passive beam dividers illustrated in FIG. 2. Such active beam dividers can be used to multiply and amplify the beam and the total available light power can be directed toward the associated subhologram with substantially no energy being lost.

It is seen that the present invention allows the use of a single beam to simultaneously read stored information from a plurality of holograms; and although it has been described with respect to preferred embodiments, it is not to be so limited as changes and modifications may be made which are within the full intended scope as defined by the appended claims.

We claim as our invention:

1. An arrangement for the holographic storage of data, comprising a light source producing a beam, a plurality of light deflectors through which said beam passes, a first beam divider mounted to receive said deflected beams, a plurality of storage modules mounted adjacent said beam divider to respectively receive said divided beams, wherein said first beam divider consists of an angle-shaped, transparent body with a plurality of light dividing surfaces arranged therein in such a manner that an entering light beam is split up into a plurality of emerging subsidiary light beams such that each of the emerging subsidiary light beams passes through or is reflected by the same number of light dividing surfaces, and wherein the light dividing surfaces are designed so that the reflected and transmitted subsidiary light beams have the same intensity.

2. An arrangement for the holographic storage of data, comprising a light source producing a beam, a plurality of light deflectors through which said beam passes, a first beam divider mounted to receive said deflected beam and a plurality of storage modules mounted adjacent said beam divider to respectively receive said divided beams, wherein said first beam divider comprises an L-shaped member having a pair of legs with the incident deflected beam entering near the junction between said legs parallel to one of the legs, a first beam reflector mounted between said pair of legs and allowing one-half of the incident beam to pass through said one leg and the other half to pass through the other of said legs, wherein a second beam reflector is mounted in said one leg to allow one-fourth of the incident beam to pass out the end of said one leg away from the junction between the legs in the longitudinal direction of said one leg and to deflect one-fourth of the incident energy transversely of said one leg, wherein a third beam reflector is mounted in said other leg to allow one-fourth of the incident beam to pass out the end of said other leg away from the junction between the legs in the longitudinal direction of said other leg, and to deflect one-fourth of the incident energy transversely of said other leg, wherein said first and third reflectors are mounted parallel to each other and said second reflector is mounted normal to said first and third reflectors, and wherein a first one of said storage modules is mounted adjacent the end of said one leg, a second one of said storage modules mounted to receive the transverse energy from said one leg, a third one of said storage modules mounted adjacent the end of said other leg, and a fourth one of said storage modules mounted to receive the transverse energy from said other leg.

3. An arrangement according to claim 1 wherein said storage modules consist of a transparent body with the side facing the incoming light beam provided with a storage plate capable of transmitting light, and a detector matrix mounted on the side of each of the storage modules facing away from the incoming light beam.

4. An arrangement according to claim 1 wherein said storage modules consist of a transparent body with the side facing away from the incoming light beam provided with a storage plate capable of reflecting light and a detector matrix mounted on the side of each of the storage modules facing the incoming light beam.

5. An arrangement according to claim 2 including a second L-shaped beam divider having a pair of legs with the incident deflected beam entering near the junction between said legs parallel to one of said legs, a fourth beam reflector mounted between said legs and allowing one-half of the incident beam to pass through one leg and one-half to pass through the other leg and one-half of the beam passing through one of said legs supplied to said first beam divider.

* * * * *